United States Patent [19]
Oguchi et al.

[11] Patent Number: 6,089,890
[45] Date of Patent: Jul. 18, 2000

[54] CARD RELEASE DEVICE

[75] Inventors: Koji Oguchi, Oksya; Tomohisa Hara, Chino, both of Japan

[73] Assignee: Hon Hai Precision Ind. Co., Ltd., Taipei Hsien, Taiwan

[21] Appl. No.: 09/212,332

[22] Filed: Dec. 15, 1998

[30] Foreign Application Priority Data

Dec. 15, 1997 [TW]  Taiwan ................................. 86220909

[51] Int. Cl.[7] .............................................. H01R 13/62
[52] U.S. Cl. ............................................................. 439/159
[58] Field of Search .............................................. 439/159

[56] References Cited

U.S. PATENT DOCUMENTS 5,784,253  7/1998  Ooka ....................................... 439/159

Primary Examiner—Lincoln Donovan
Assistant Examiner—Javaid Nasri

[57] ABSTRACT

A card release device adapted to be incorporated in an electronic card connector to automatically release a card therefrom includes a motor controlled by a control circuit to drive a reduction gear train which in turn drives a cam-follower system to convert rotational motion of the motor into linear motion for driving a release bar. The release bar is coupled with a card ejecting mechanism including a lever arm for facilitating ejection of the card from the card connector. The release bar has a free end located outside the card connector with a push button provided thereon for receiving a force to drive the release bar and eject the card from the card connector. Thus, the card release device can be operated both manually and automatically.

13 Claims, 14 Drawing Sheets

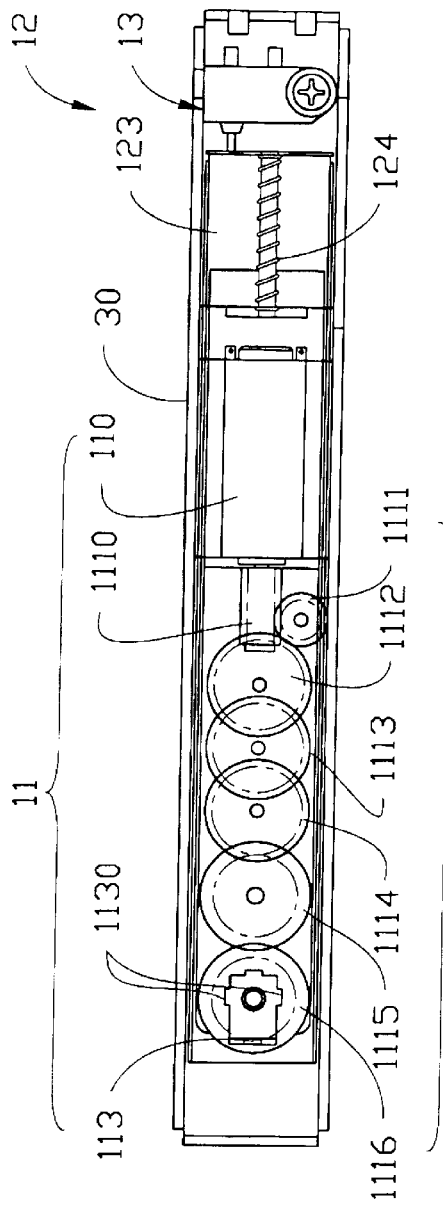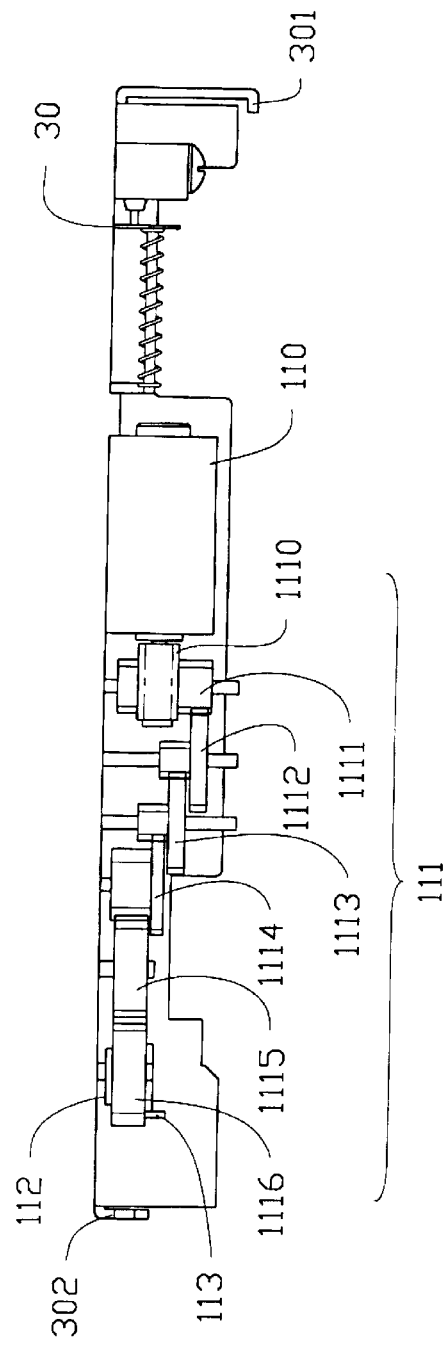
FIG.2
FIG.3

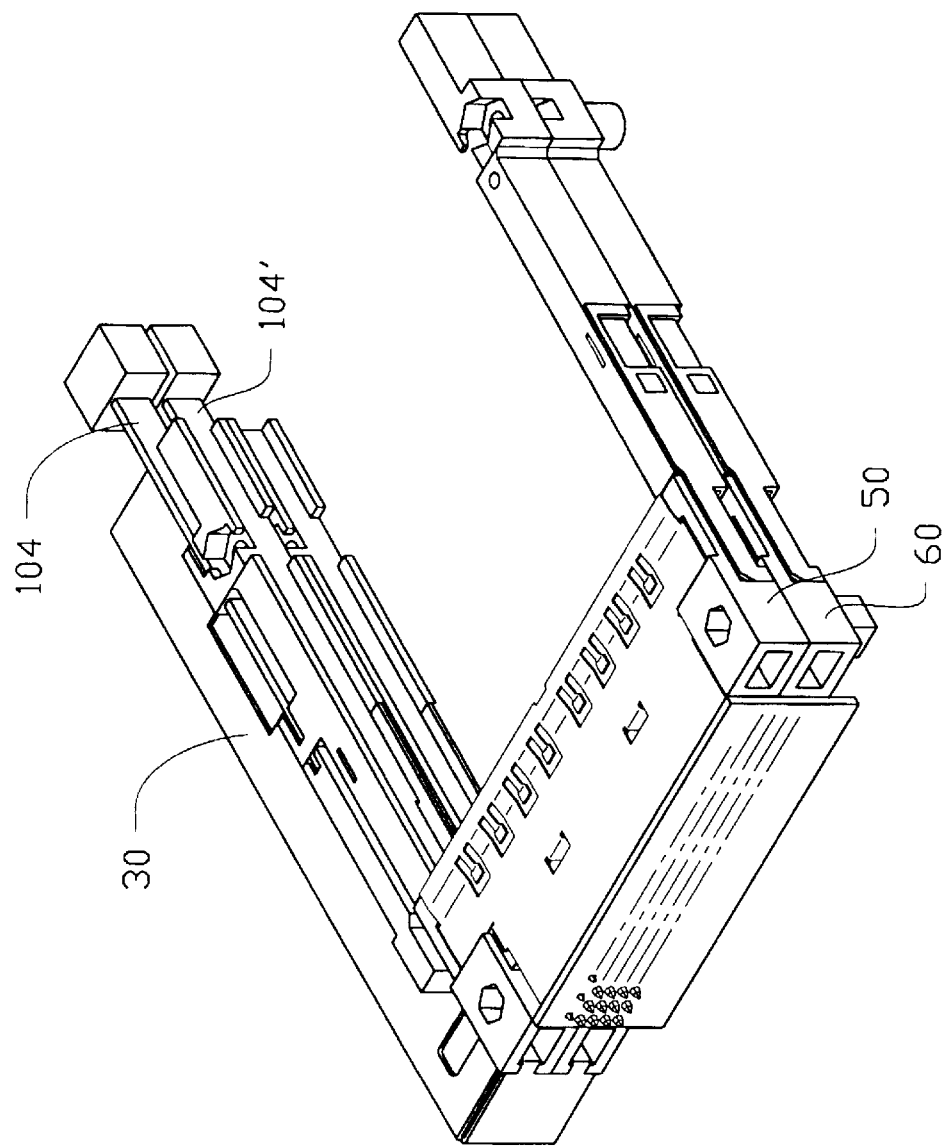

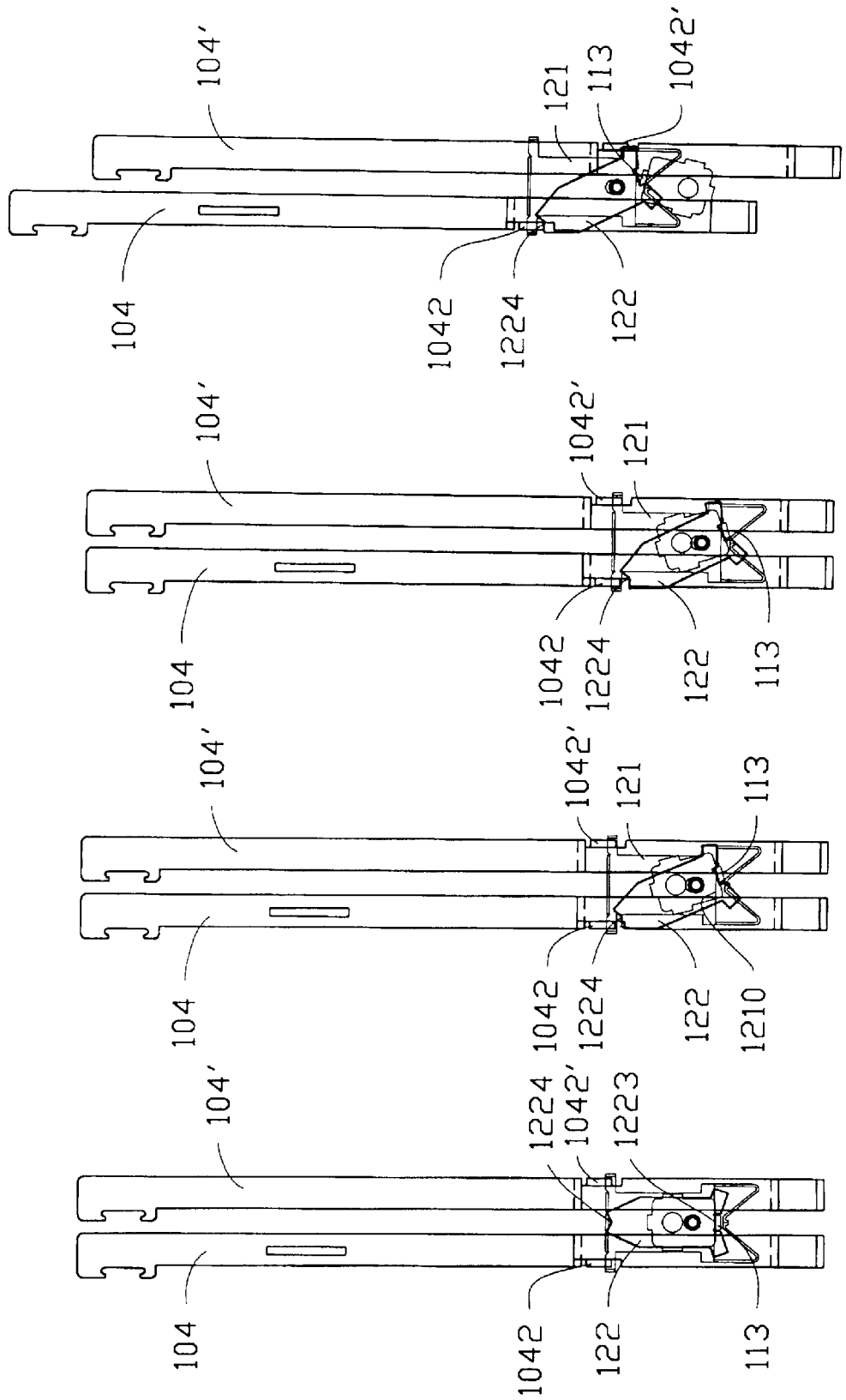

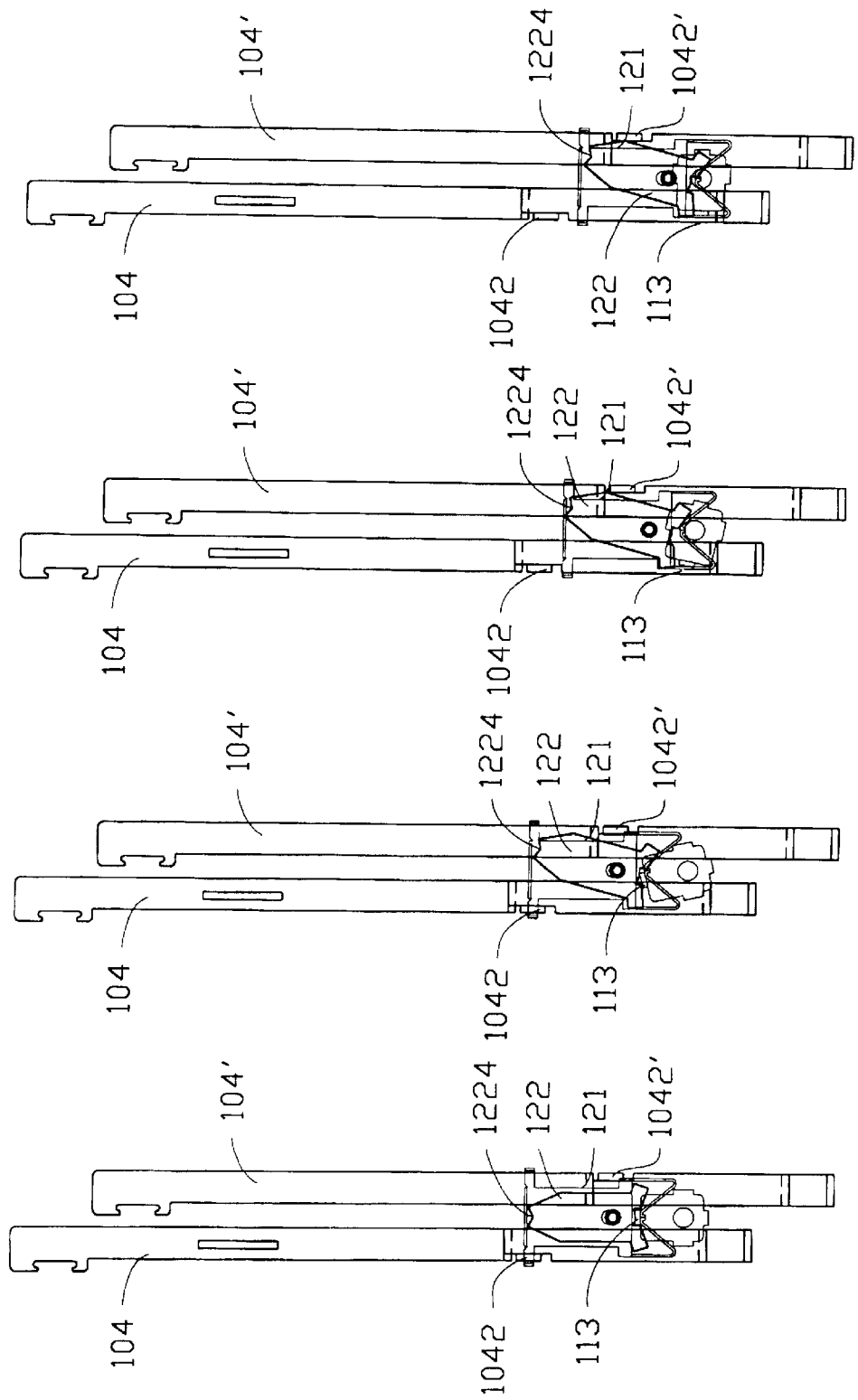

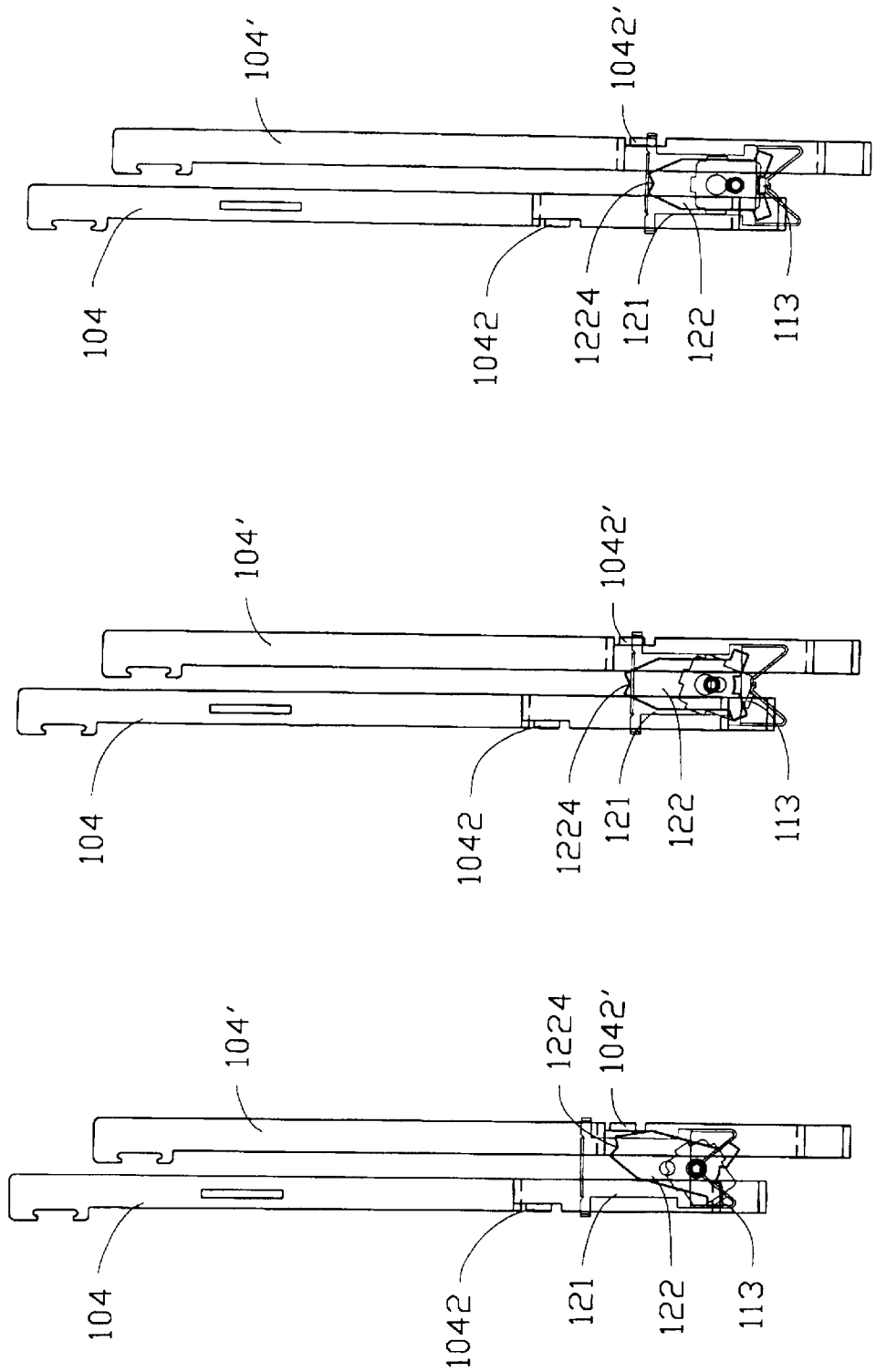

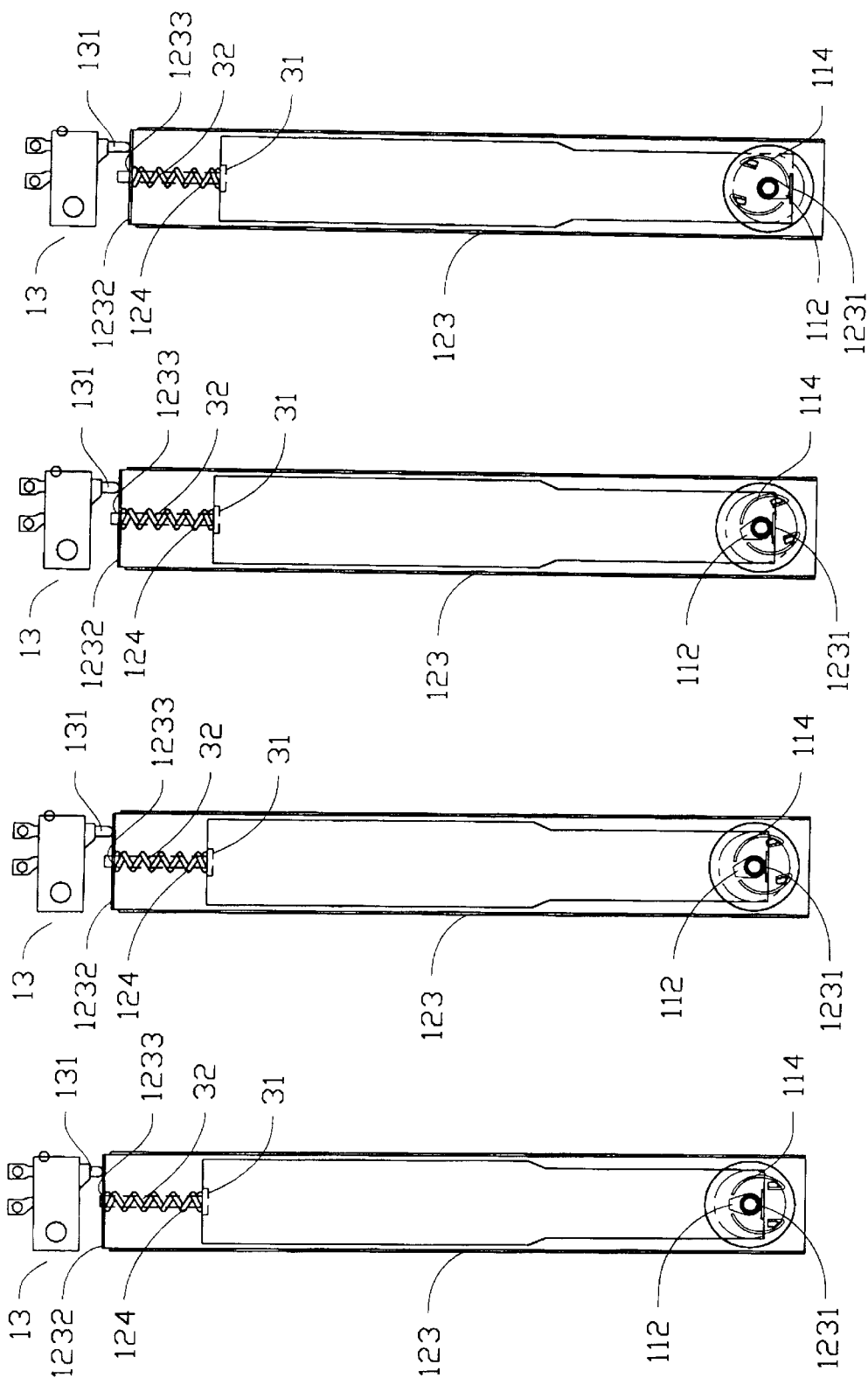

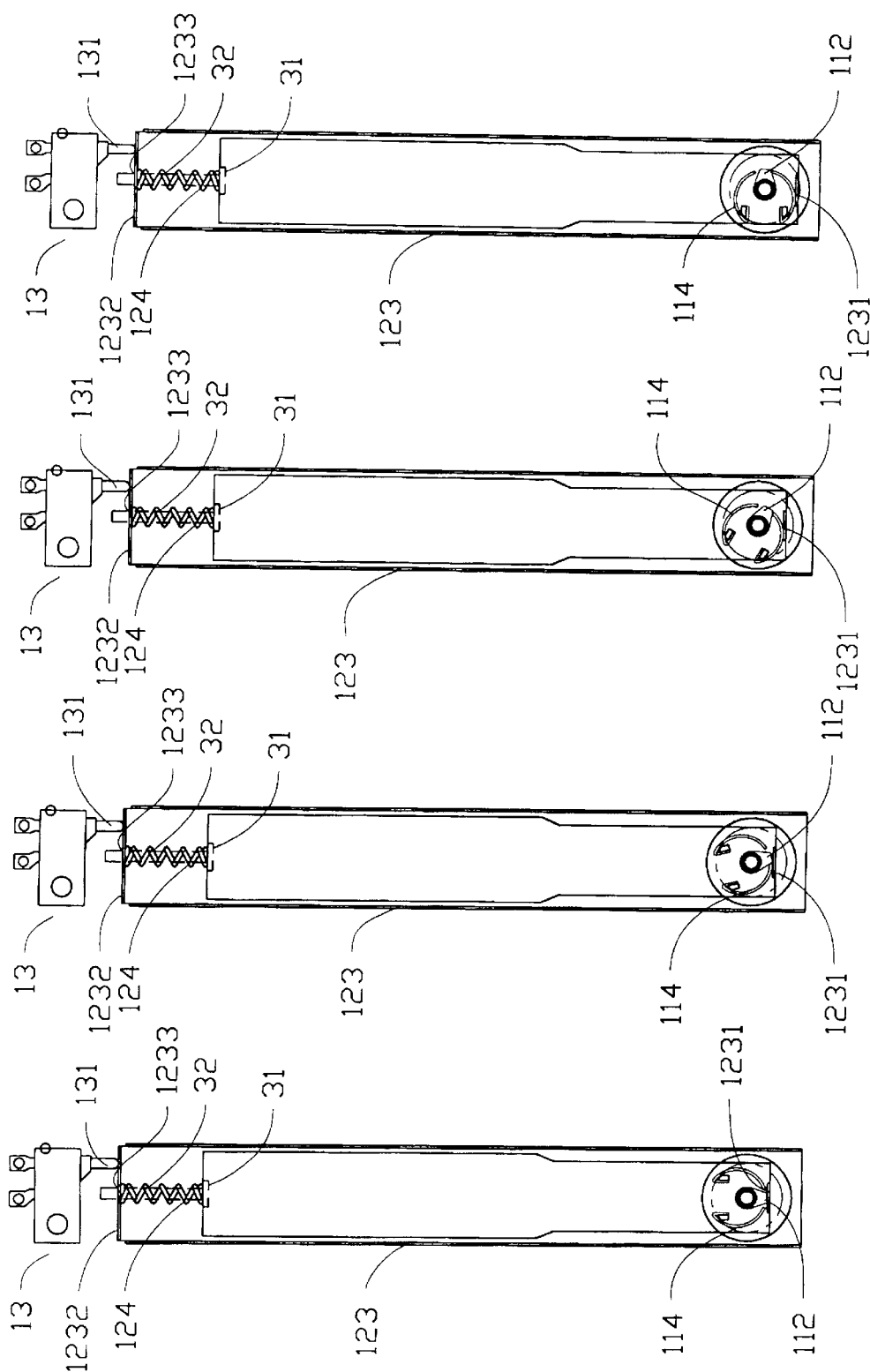

CARD RELEASE DEVICE

FIELD OF THE INVENTION

The present invention relates generally to an electronic card release device, and in particular to an electronic card release device which can discharge an electronic card both manually and automatically.

BACKGROUND OF THE INVENTION

Portable computers are usually provided with at least one electronic card connector for receiving an external electronic card. The electronic card connector is provided with a card release device to disengage the card from the card connector. Taiwan Patent Application Nos. 82102557, 82109139 and 83107162 and U.S. Pat. Nos. 5,324,204, 5,383,789 and 5,421,737 disclose pertinent structures.

A conventional card release device 9 incorporated with an electronic card connector 8 is shown in FIG. 1. The card release device 9 comprises two elongate guides 90 mounted to two support arms 802 extending from an insulative body 80 of the electronic card connector 8. Pins 801 are assembled in the body 80 between the support arms 802. A shielding plate 93 is formed between the two guides 90. A card release plate 91 is slidably attached between the two guides 90 for driving the electronic card (not shown) out of the card connector 8. A release bar 94 is movably received in one of the guides 90, and has a free end extending beyond the guide 90 with a manual push button 901 fixed thereto. A lever arm 92 is engaged with an opposite end of the release bar 94. The lever arm 92 is also pivotably attached to the card release plate 91 whereby when the release bar 94 is pushed inward via the push button 901, the lever arm 92 pivots and drives the card release plate 91 to eject the card from the card connector 8.

Although such a conventional arrangement works well, certain disadvantages exist. A manual force must be applied to the push button 901 to actuate the card release plate 91 and eject the card from the card connector. This may be difficult for some users, especially the disabled.

Thus, it is desirable to have a card release device which can automatically eject a card from a card connector.

SUMMARY OF THE INVENTION

An object of the present invention is to provide an electronic card release device which can be operated both automatically and manually.

To achieve the above object, an electronic card release device in accordance with the present invention is adapted to be incorporated in an electronic card connector for automatically releasing a card therefrom. The card release device comprises a motor controlled by a control circuit to drive a reduction gear train which in turn drives a cam-follower system to convert rotational motion of the motor into linear motion for driving a release bar. The release bar is coupled with a card ejecting mechanism comprising a lever arm for facilitating disengagement of the card from the card connector.

In accordance with another aspect of the present invention, the release bar has a free end located outside the card connector. A push button is provided on the free end of the release bar for receiving a push force to drive the release bar and eject the card from the card connector.

BRIEF DESCRIPTION OF THE DRAWINGS

The present invention will be apparent to those skilled in the art by reading the following description of the preferred embodiment thereof, with reference to the accompanying drawings, in which:

FIG. 2 is a side elevational view of a card release device constructed in accordance with the present invention;

FIG. 3 is top plan view of FIG. 2;

FIG. 5A is a perspective view of a stacked electronic card connector system wherein a card release device in accordance with the present invention is incorporated therewith;

FIGS. 6A–6K are operational views of a card release mechanism of the card release device of the present invention;

FIGS. 7A–7K are operational views of a second movable member of the card release mechanism of the card release device of the present invention;

DETAILED DESCRIPTION OF THE PREFERRED EMBODIMENT

Figure 1:
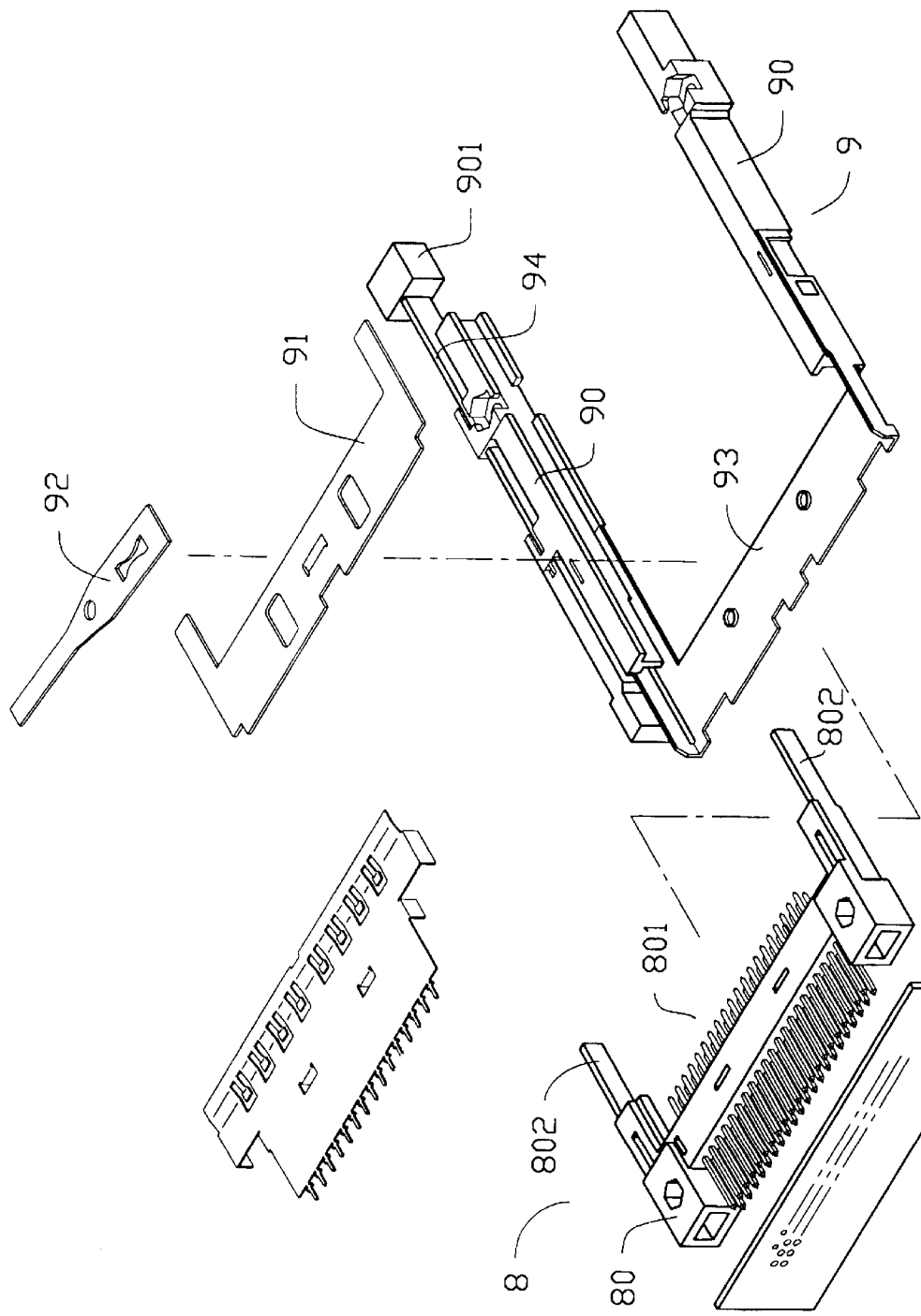
FIG. 1 is an exploded view of an electronic card connector and a conventional card release device.
Figure 4:
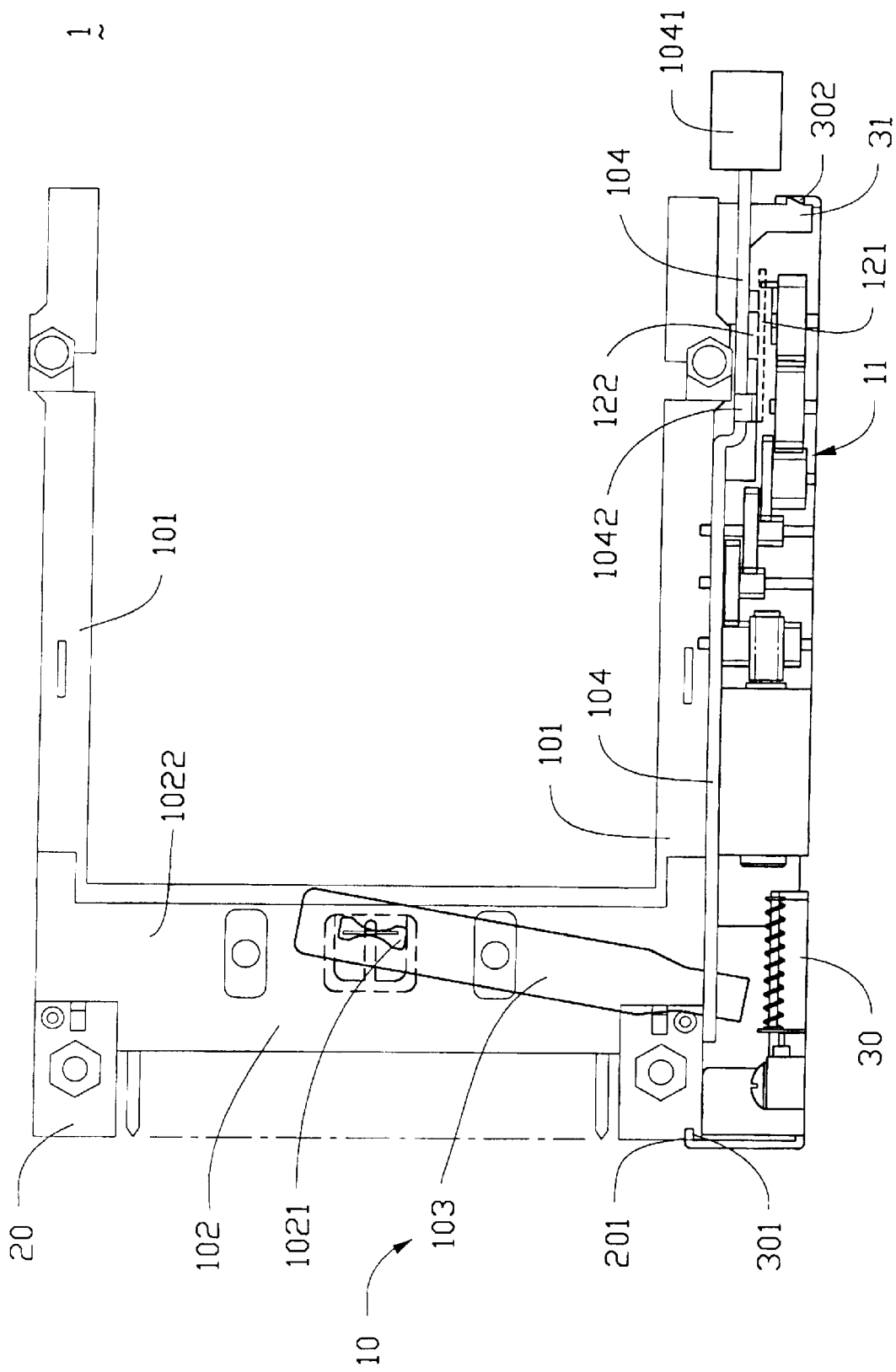
FIG. 4 is a top plan view of an electronic card connector wherein the card release device in accordance with the present invention is incorporated therewith.

With reference to the drawings and in particular to FIGS. 2, 3, and 4, an electronic card connector system comprising a card connector 20 and a card release device 1 constructed in accordance with the present invention to eject an electronic card received in the card connector 20 is shown. The card release device 1 comprises a card ejecting mechanism 10, a transmission system 11, a card release mechanism 12 and a control circuit 13.

The card ejecting mechanism 10 is mounted on the card connector 20 and comprises a pair of elongate card guides 101 fixed to opposite ends of the card connector 20 for guiding an electronic card (not shown) into/out of the card connector 20. A release bar 104 is movably received in one of the guides 101 and has a free end located outside the guide 101 with a push button 1041 fixed thereon for manually operating the release bar 14. A lever arm 103 is pivotably connected to a central connecting portion 1021 of the card connector 20. One end of the lever arm 103 is engaged with an end of the release bar 104 and an opposite end thereof is engaged with the card release plate 102 whereby when the release bar 104 is moved into the card connector 20, the lever arm 103 pivots thereby driving the card release plate 102 to move with respect to the guides 101. A force from the card release plate 102 is exerted on the card thereby ejecting the card from the card connector 20. The card release plate 102 comprises two opposite end sections 1022 which engage with the card when ejecting the card from the card connector 20.

Preferably, the distance between the pivot point of the lever arm 103 and the engagement thereof with the release bar 104 is greater than that between the pivot point of the lever arm 103 and the engagement thereof with the card release plate 102 thereby reducing the force required to eject the card from the card connector 20.

Inward movement of the release bar 104 may also be achieved automatically, whereby the transmission system 11 is actuated by means of the control circuit 13 to drive the card release mechanism 12 which moves the release bar 104.

Referring especially to FIGS. 2 and 3, the transmission system 11 and the card release mechanism 12 are housed in a casing 30 which has two engaging elements 301, 302 engaging with counterpart means 201, 31 respectively provided on the card connector 20 and the guide 101 on which the release bar 104 is arranged.

The transmission system 11 comprises a rotational source 110, preferably an electrical motor, having an output shaft (not shown) on which a worm 1110 is mounted, and a gear train 111 having a worm gear 1111 mating with the worm 1110 and thus driven thereby. The gear train 111 also comprises a reduction gear train comprising a first gear 1112 driven by the worm gear 1111 and a second gear 1113, a third gear 1114, a fourth gear 1115 and a fifth gear 1116 mating with and driven by each other in sequence. The fifth gear 1116 serves as an output gear of the gear train 111.

Figure 8A:
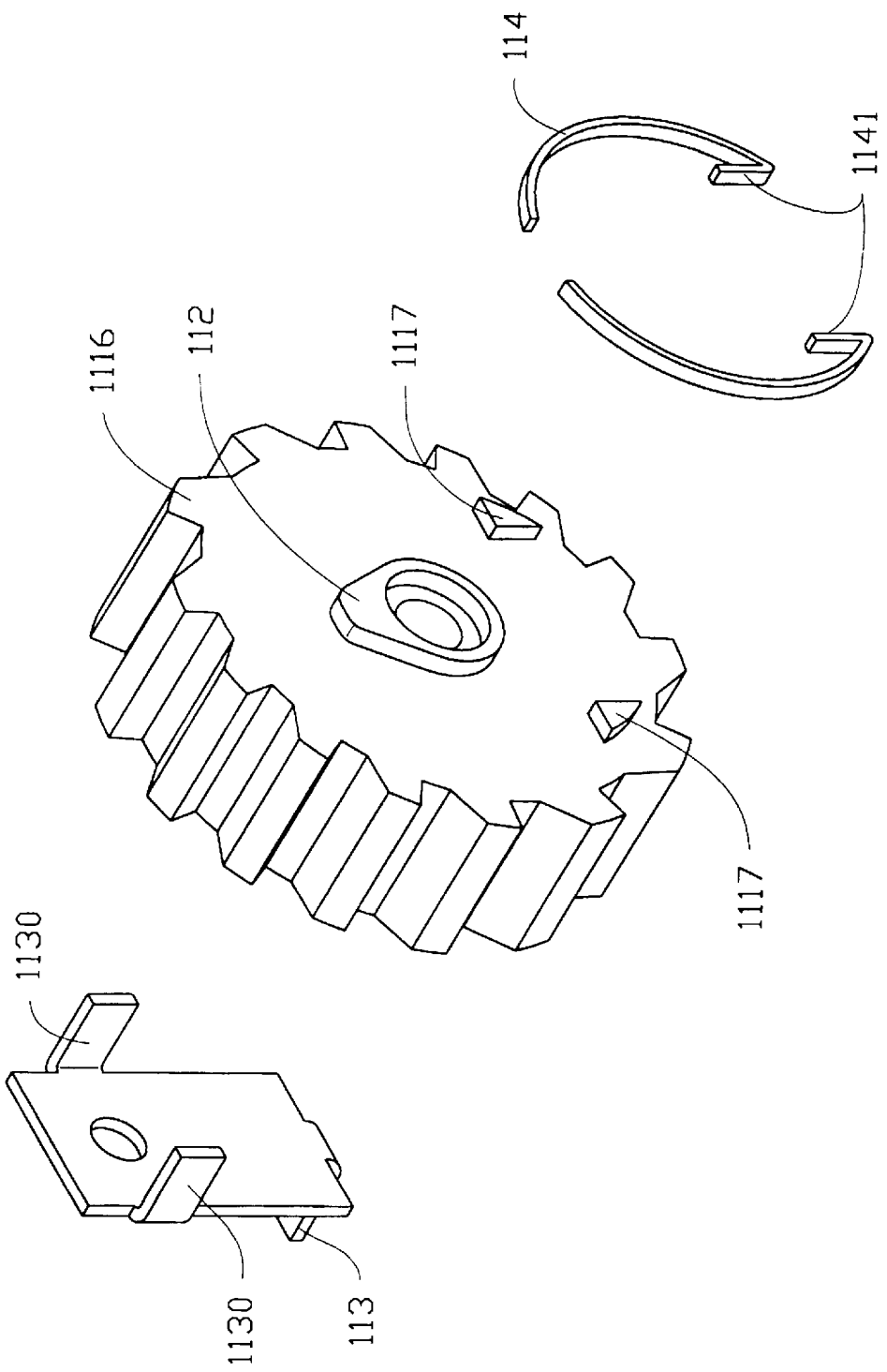
FIG. 8A is an exploded view of an output gear of a gear train of a transmission mechanism of the card release device of the present invention.
Figure 8B:
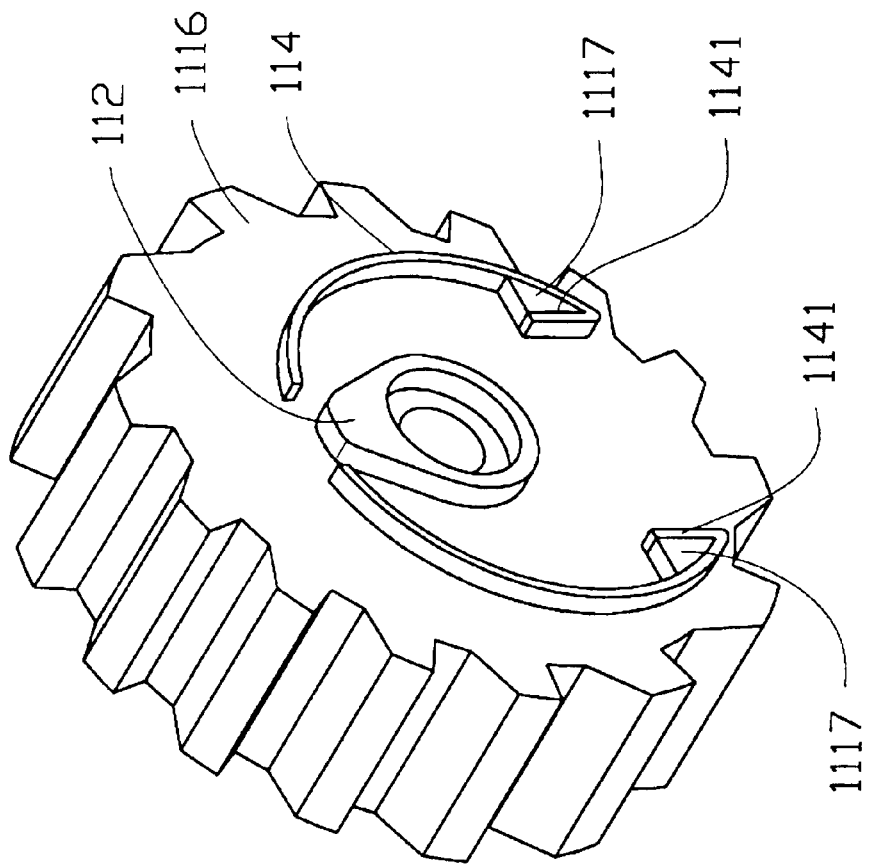
FIG. 8B is an assembled view of FIG. 8A.

Referring to FIG. 8A, a projection 112 is formed on a first side of the fifth gear 1116 and rotates in unison therewith thereby serving as a cam. The first side of the fifth gear 1116 also comprises two guiding arc members 114 fixed thereon. Each of the guiding arc members 114 has a bent end 1141 engaged with and fixed in position by a corresponding projection 1117 formed on the first side of the fifth gear 1116 thereby defining a fixed end of the arc member 114. A driving element 113 is concentrically fixed on a second side of the fifth gear 1116. The driving element 113 comprises two mounting sections 1130 for engaging with counterpart means (not shown) provided on the fifth gear 1116 (FIG. 2).

Figure 9:
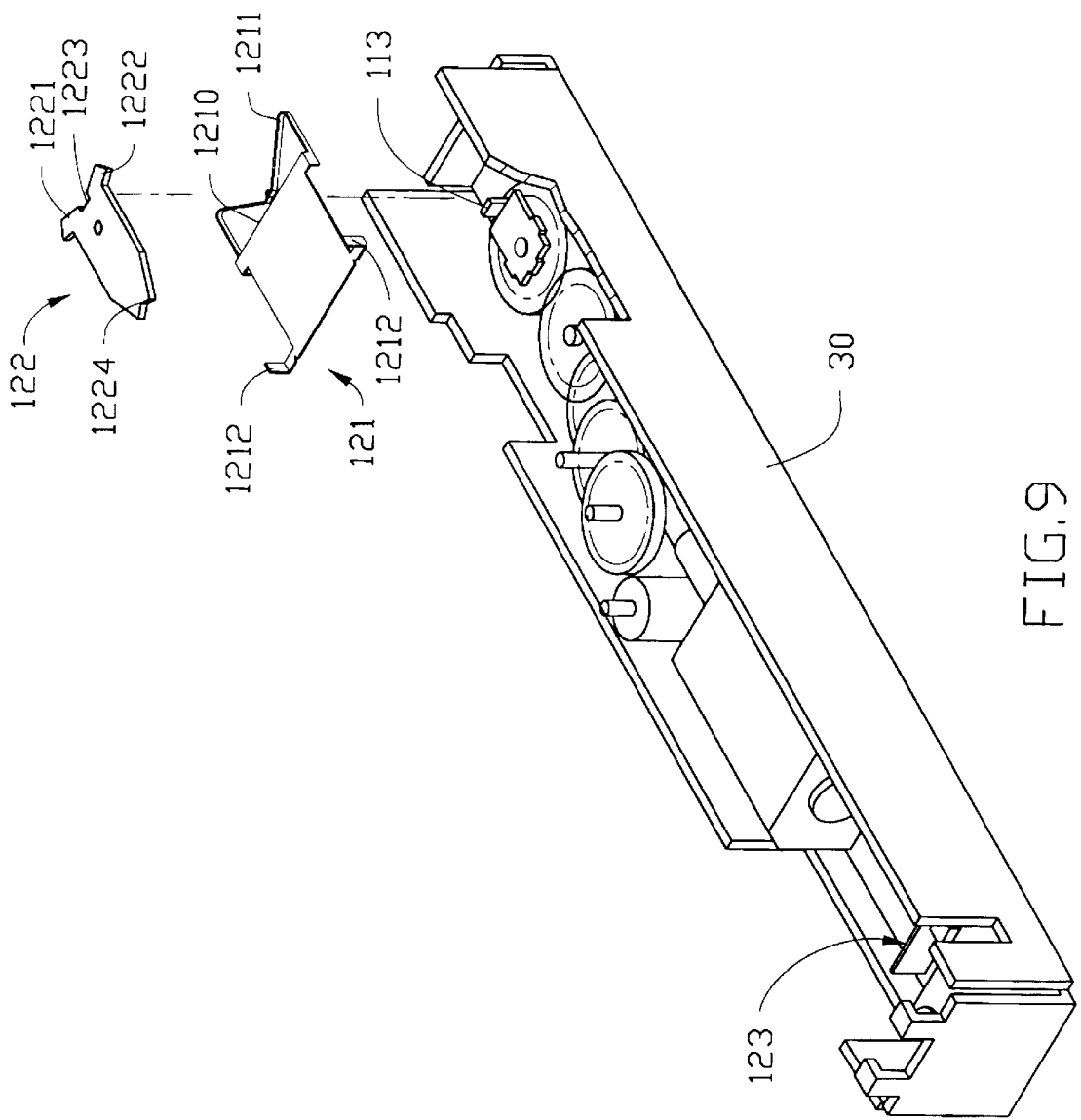
FIG. 9 is an exploded view of the card release mechanism of the card release device of the present invention.

Also referring to FIG. 9, the card release mechanism 12 comprises a first movable member 121 movably received inside the casing 30, comprising two guide tabs 1212 for slidably engaging with opposite sides of the casing 30 thereby guiding the first movable member 121 along the casing 30 in the longitudinal direction of the guide 101 to which the casing 30 is fixed. In this respect, the sides of the casing 30 serve as guide rails for the guide tabs 1212 of the first movable member 121. The first movable member 121 further comprises a guiding edge 1210 slidably engaged with the driving element 113 of the fifth gear 1116 of the gear train 111. The sliding engagement between the guiding edge 1210 of the first movable member 121 and the driving element 113 of the fifth gear 1116 prevents relative movement therebetween in the longitudinal inward direction while allowing relative movement in a transverse direction whereby the rotation of the fifth gear 1116 is converted into linear movement of the first movable member 121 in the longitudinal direction due to the sliding engagement between the first movable member 121 and the driving element 113 and the sliding engagement between the guide tabs 1212 of the first movable member 121 and the casing 30.

The first movable member 121 also comprises a returning spring 1211 which, in the preferred embodiment, is an M-shaped resilient strip having ends thereof fixed to the guiding edge 1210 thereby defining a space (not labeled) therebetween for accommodating the driving element 113 of the fifth gear 1116 therein. The space provides sufficient clearance for the driving element 113 to move and rotate therein.

The card release mechanism 12 further comprises a selection member 122 pivotably supported on the first movable member 121, defining a notch 1224 in one end thereof and forming two diverging extensions 1221, 1222 on an opposite end thereof. A recess 1223 is defined in the selection member 122 between the two diverging extensions 1221 and 1222. The recess 1223 receives the driving element 113 of the fifth gear 1116 therein whereby when the driving element 113 is rotated by the fifth gear 1116, the driving element 113 drives the selection member 122 to rotate about the pivot thereof and the rotation of the selection member 122 moves the notch 1224 toward a lug 1042 of the release bar 104 until the notch 1224 engages with the lug 1042. Further rotation of the fifth gear 1116 moves the driving element 113 further inward in the longitudinal direction thereby driving the release bar 104 inward in the longitudinal direction which causes the lever arm 103 and card release plate 102 to eject the card from the card connector 20 as demonstrated in FIGS. 6A–6D. Thereafter, the notch 1224 disengages from the lug 1042 of the release bar 104 and the selection member 122 rotates back to its original position. The driving element 113 interacts with the two diverging extensions 1221, 1222 and the recess 1223 of the selection member 122, and movement of the driving element 113 is confined and spring-biased by the M-shaped returning spring 1211 to ensure proper operation thereof.

Referring to FIG. 7A, the card release mechanism 12 further comprises a second movable member 123 having an elongate plate (not labeled) movably received in the casing 30. The second movable member 123 has a first end forming a tab 1231 and a second end on which an end plate 1232 is mounted. The tab 1231 is engaged with the cam 112 thereby serving as a follower. A biasing spring 124 is arranged between the end plate 1232 of the second movable member 123 and a projection 31 of the casing 30 for exerting a biasing force on the second movable member 123. Preferably, the spring 124 is a helical spring enclosing and thus supported by a support rod 32 fixed to and extending from the projection 31 toward the end plate 1232 of the second movable member 123. The end plate 1232 defines a hole 1233 through which the support rod 32 extends when the spring 124 is compressed.

The control circuit 13 comprises a micro-switch 131 engaged with the end plate 1232 of the second guide plate 123. The micro-switch 131, once actuated, causes the motor 110 to rotate which in turn drives the fifth gear 1116 and thus the cam 112 and the driving element 113 thereon to rotate via the gear train 111. Due to the cam-follower engagement between the cam 112 and the tab 1231 of the second movable member 123 of the card release mechanism 12, the rotation of the cam 112 caused by the fifth gear 1116 drives the second movable member 123 to move outward with respect to the casing 30 in the longitudinal direction as shown in FIGS. 7A–7D. The spring 124 is compressed and the distance between the end plate 1232 and the micro-switch 131 changes.

Figure 7I:
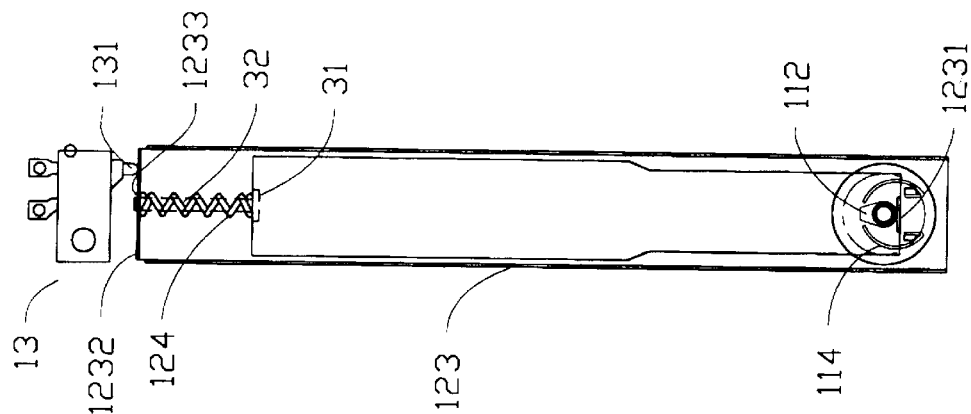
Figure 7J:
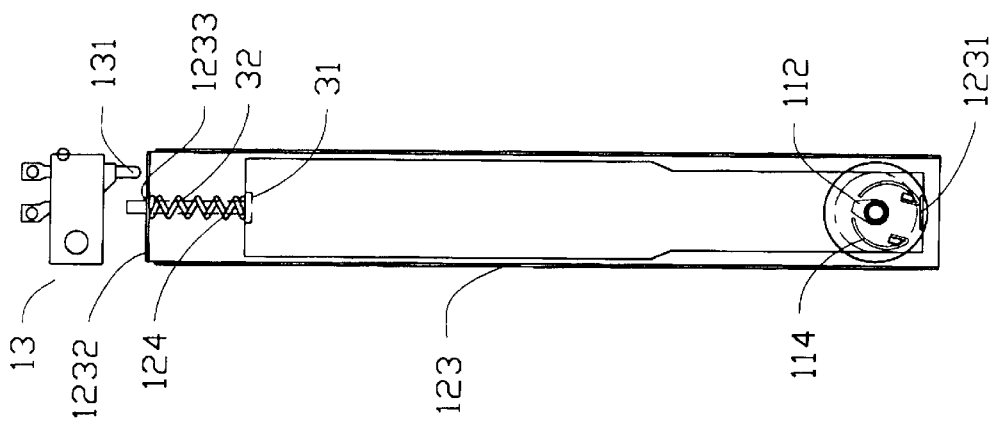
Figure 7K:
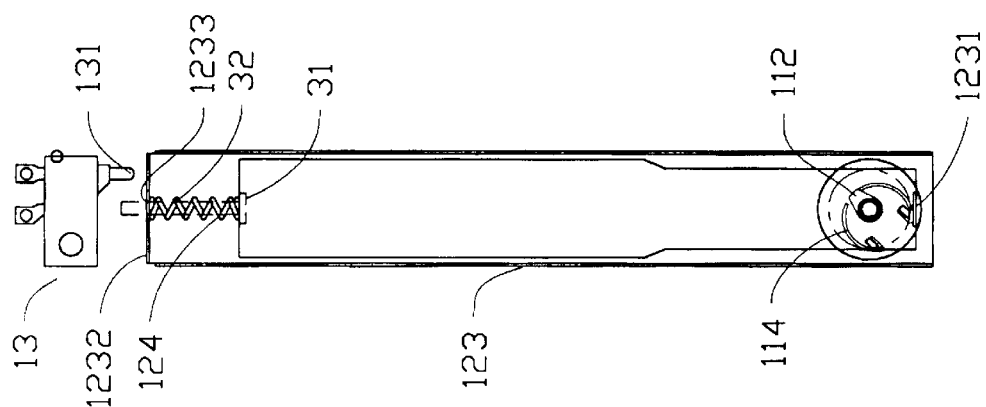

The cam 112 and the arc members 114 are sized and positioned such that a top point of the contour of the cam 112 is substantially aligned with free ends of the arc members 114 and located therebetween as shown in FIG. 7A. When the rotation of the cam 112 displaces the follower tab 1231 to the top point of the cam contour, as shown in FIG. 7E, the follower tab 1231 engages with and is supported by at least one of the arc members 114 whereby further rotation of the cam 112 moves the follower tab 1231 from the cam 112 to one of the arc members 114 and, thereafter, the arc member 114 resumes the function of the cam 112 and the follower tab 1231 moves along the arc member 114, as seen in FIGS. 7F–7J. The bent ends 1141 of the arcs members 114 are sufficiently spaced from each other for allowing the follower tab 1231 to move therethrough without constraint. Thus, when the follower tab 1231 moves along the arc member 114 to the space defined between the bent ends 1141 of the arc members 114, the follower tab 1231 is biased to engage with the cam 112 due to the biasing force of the spring 124, as shown in FIG. 7K.

When the follower tab 1231 moves along the arc member 114, the distance between the end plate 1232 of the second movable member 123 and the micro-switch 131 is further increased until disengagement results, as shown in FIGS. 7E–7J. This de-actuates the micro-switch 131 thereby halting rotation of the motor 110.

As mentioned above, the rotation of the driving element 113 caused by the fifth gear 1116 and synchronous with that of the cam 112 causes the selection member 122 to drive the release bar 104 longitudinally inward thereby ejecting the card from the card connector 20. The driving element 113 is arranged such that when the movement of the follower tab 1231 caused by the cam 112 stops the motor 110, the driving element 113 causes the selection member 122 to resume its original position.

As shown in FIGS. 6A–6D, when the motor 110 is actuated to drive the gear train 111, the fifth gear 1116 and the driving element 113 mounted thereon are rotated. During rotation of the driving element 113, due to the concentricity of the driving element 113 with respect to a rotational axis of the fifth gear 1116, the driving element 113 engaging with the recess 1223 of the selection plate 122 first rotates the selection plate 122 whereby the notch 1224 of the selection plate 122 engages with the lug 1042 of the release bar 104 and then moves the selection plate 122 inward in the longitudinal direction thereby forcing the release bar 104 inward to actuate the card release plate 102 and eject the card from the card connector 20. Further rotation of the fifth gear 1116 returns the selection plate 122 to its original position, as shown in FIGS. 6E–6K.

Figure 5B:
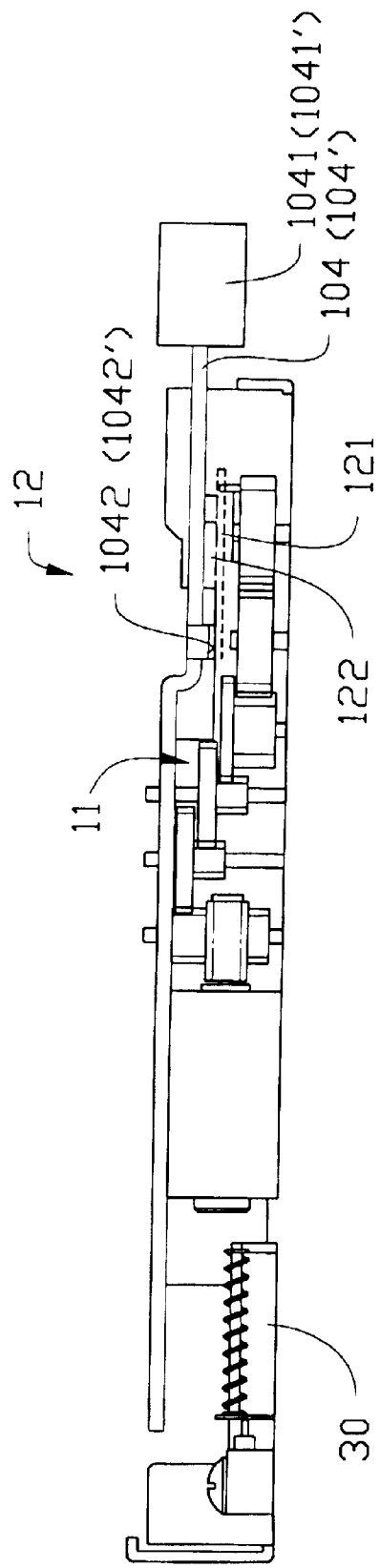
FIG. 5B is a top plan view of the card release device to be incorporated with the stacked electronic card connector system.

In FIGS. 5A and 5B, a stacked card connector system incorporates the card release device of the present invention. The stacked card connector system comprises two connectors 50 and 60 assembled together, each having a release bar 104, 104' with a manual push button 1041, 1041' mounted thereto. A casing 30 is mounted to one side of the stacked card connector system and comprises a transmission system 11 and a card release mechanism 12 assembled therein. The transmission system 11 and the card release mechanism 12 are similar to those previously described thus a detailed description thereof is not required.

To perform a card release operation for both connectors 50, 60 with only a single card release mechanism 12, the motor 110 can selectively rotate in clockwise and counterclockwise directions. Assuming the clockwise rotation of the motor 110 causes the selection member 122 to engage and drive the release bar 104 as shown in FIGS. 6A–6D, then the counterclockwise rotation of the motor 110 would cause the selection member 122 to engage and drive the release bar 104'. Thus, cards in both connectors 50, 60 may be alternately released.

If the motor 110 or related mechanisms malfunction, a force may be exerted on the push button 1041, 1041' to actuate the release bar 104, 104' inward and eject the card from the card connector 50, 60.

Although the present invention has been described with reference to a preferred embodiment thereof, it is apparent to those skilled in the art that there are a variety of modifications and changes that may be made without departing from the scope of the present invention defined by the appended claims.

What is claimed is:

1. A card release device adapted to be incorporated in an electronic card connector system including at least one connector, comprising:

a card ejecting mechanism mounted on each card connector for exerting a force on the card when actuated thereby ejecting the card from the card connector;

a rotation source controlled by a control circuit comprising a control switch;

a transmission system mechanically coupled with the rotation source and driven thereby, the transmission system comprising an output gear for outputting a rotational motion; and converting means for converting the rotational motion of the output gear into a linear motion in a first direction applicable to a release bar coupled with the card ejecting mechanism of each card connector thereby driving the release bar to cause the card ejecting mechanism to exert an ejecting force on the card, the converting means comprising a driving element fixed on the output gear and concentric with respect to a rotational axis of the output gear, a first movable member movable in the first direction having a guiding edge extending in a second direction not parallel to the first direction and slidably engaged with the driving element whereby the rotation of the driving element about the rotational axis of the output gear drives the first movable member to move in the first direction, and a selection member mounted on the first movable member defining a front notch engageable with a lug formed on the release bar for driving the release bar to move in the first direction.

2. The card release device as claimed in claim 1, wherein the card connector system comprises two connectors each having an associated card ejecting mechanism and a release bar, the release bars being arranged whereby the lugs thereof are selectively engageable with the front notch of the selection member, and wherein the selection member is pivotably engaged with the first movable member, the selection member defining a back notch bounded by a pair of diverging extensions defining a recess therebetween, the driving element being received in the recess whereby when the driving element is rotated by the output gear the driving element engaging with the recess of the selection member rotates the selection member about the pivot thereof whereby the front notch thereof selectively engages with the lug of one of the release bars.

3. The card release device as claimed in claim 1, wherein the first movable member comprises a returning spring in the form of an M-shaped strip having two ends fixed to the guiding edge of the first movable member thereby defining a space therebetween for accommodating the movement of the driving element.

4. The card release device as claimed in claim 1, wherein the first movable member comprises two spaced guide tabs and wherein the card release device comprises guide rails along which the guide tabs of the first movable member are slidably guided.

5. The card release device as claimed in claim 1, further comprising control means for controlling the control circuit, the control means comprising a second movable member driven by the output gear to be movable in the first direction from a first position to a second position, the second movable member comprising an end member engaging with the control switch of the control circuit when the second movable member is at the first position and disengaging from the control switch of the control circuit when the second movable member is at the second position.

6. The card release device as claimed in claim 5, wherein the output gear forms a cam device thereon defining a cam path and the control means comprises a follower member mounted on the second movable member, the second movable member being spring-biased for engaging the follower member with the cam device whereby when the cam device is rotated with the output gear, the follower member moves along the cam path thereby driving the second movable member to move in the first direction.

7. The card release device as claimed in claim 6, wherein the cam device includes a cam mounted on the output gear, the cam having a cam contour forming a top point, and two arc members having an end fixed to the output gear whereby a free end of each of the arc members is substantially in alignment with the top point of the cam contour, the fixed ends of the arc members being sufficiently spaced to allow the follower member to move therethrough without constraint, the cam path being defined from the position where the follower member initially engages with the cam along the cam contour to the top point and then along one of the arc members from the free end thereof to the fixed end, the arc member being arranged such that when the follower member moves to the fixed end, the second movable member reaches the second position.

8. The card release device as claimed in claim 1, wherein the rotation source comprises an electrical motor.

9. The card release device as claimed in claim 8, wherein the transmission system comprises a worm mounted on an output shaft of the motor and a worm gear mating with the worm, a reduction gear train being coupled between the worm gear and the output gear.

10. The card release device as claimed in claim 1, wherein the card ejecting mechanism comprises a pair guides mounted on opposite sides of the connector to guide the card, a card release plate movably arranged between the two guides and a lever arm pivotably attached to the connector and having opposite ends engaged with the card release plate and the release bar, respectively.

11. The card release device as claimed in claim 10, wherein a pivot point of the lever arm is spaced from the engagement thereof with the release bar a first distance and wherein the pivot point of the lever arm is spaced from the engagement thereof with the card release plate a second distance, the first distance being greater than the second distance.

12. The card release device as claimed in claim 1, wherein the release bar has a free end located outside the card release device with a manual push button mounted thereon for receiving a push force to manually move the release bar inward thereby actuating the card ejecting mechanism to eject a card from the connector.

13. An electronic card connector system comprising:

at least one card connector adapted to receive and mechanically and electrically engage with an electronic card; and a card release device comprising:

a card ejecting mechanism mounted on each card connector for exerting a force on the card when actuated thereby ejecting the card from the card connector;

a rotation source controlled by a control circuit comprising a control switch;

a transmission system mechanically coupled with the rotation source and driven thereby, the transmission system comprising an output gear for outputting a rotational motion; and converting means for converting the rotational motion of the output gear into a linear motion in a first direction applicable to a release bar coupled with the card ejecting mechanism of each card connector thereby driving the release bar to cause the card ejecting mechanism to exert a force on the card, the converting means comprising a driving element fixed on the output gear and concentric with respect to a rotational axis thereof, a first movable member movable in the first direction having a guiding edge extending in a second direction not parallel to the first direction and slidably engaged with the driving element whereby the rotation of the driving element about the rotational axis of the output gear drives the first guide member to move in the first direction, and a selection member mounted on the first movable member defining a front notch for engaging with a lug formed on the release bar thereby driving the release bar to move in the first direction.

* * * * *